(12) United States Patent
Lin et al.

(10) Patent No.: US 12,342,622 B2
(45) Date of Patent: Jun. 24, 2025

(54) DISPLAY SUBSTRATE COMPRISING SUB-PIXEL STRUCTURES HAVING A TARGET SUB-PIXEL STRUCTURE AND DISPLAY DEVICE

(71) Applicants: Fuzhou BOE Optoelectronics Technology Co., Ltd., Fujian (CN); BOE TECHNOLOGY GROUP CO., LTD., Beijing (CN)

(72) Inventors: Linlin Lin, Beijing (CN); Bo Hu, Beijing (CN); Yao Liu, Beijing (CN)

(73) Assignees: FUZHOU BOE OPTOELECTRONICS TECHNOLOGY CO., LTD., Fujian (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/021,621

(22) PCT Filed: Apr. 29, 2022

(86) PCT No.: PCT/CN2022/090123
§ 371 (c)(1),
(2) Date: Feb. 16, 2023

(87) PCT Pub. No.: WO2023/206315
PCT Pub. Date: Nov. 2, 2023

(65) Prior Publication Data
US 2024/0266357 A1 Aug. 8, 2024

(51) Int. Cl.
*H10D 86/60* (2025.01)
*G02F 1/1343* (2006.01)
(Continued)

(52) U.S. Cl.
CPC ....... *H10D 86/60* (2025.01); *G02F 1/134336* (2013.01); *G02F 1/134345* (2021.01);
(Continued)

(58) Field of Classification Search
CPC ............... G02F 1/1343; G02F 2203/30; G02F 2202/02; G02F 2201/128
See application file for complete search history.

(56) References Cited

U.S. PATENT DOCUMENTS

2015/0227013 A1* 8/2015 Hao .................. G02F 1/136286
257/72
2018/0341141 A1* 11/2018 Lin .................... G02F 1/133514
2021/0325748 A1* 10/2021 Li ...................... G02F 1/134336

FOREIGN PATENT DOCUMENTS

CN 101063781 A 10/2007
CN 101666948 A 3/2010
(Continued)

*Primary Examiner* — Paul C Lee
(74) *Attorney, Agent, or Firm* — WHDA, LLP (57) ABSTRACT

The present disclosure provides a display substrate and a display device. The display substrate includes a first substrate, and scanning lines and data lines arranged on the first substrate. The display substrate includes a plurality of pixel structures, each pixel structure includes a plurality of sub-pixel structures, each sub-pixel structure includes a common electrode and a pixel electrode, and an orthogonal projection of the common electrode onto the first substrate overlaps with an orthogonal projection of the pixel electrode onto the first substrate. The sub-pixel structures include a target sub-pixel structure, the common electrode of the target sub-pixel structure includes a first portion, a second portion, a third portion, and a fourth portion, and the first portion and the second portion are arranged along a first direction and extend along a second direction.

19 Claims, 8 Drawing Sheets

(51) Int. Cl.
*G02F 1/1362* (2006.01)
*G02F 1/139* (2006.01)
*H10D 86/40* (2025.01)

(52) U.S. Cl.
CPC .. *G02F 1/136209* (2013.01); *G02F 1/136286* (2013.01); *H10D 86/441* (2025.01); *G02F 1/1396* (2013.01)

(56) References Cited

FOREIGN PATENT DOCUMENTS

| | | |
|---|---|---|
| CN | 203117619 U | 8/2013 |
| CN | 103779360 A | 5/2014 |
| CN | 103926757 A | 7/2014 |
| CN | 205620654 U | 10/2016 |
| CN | 106094323 A | 11/2016 |
| CN | 107065319 A | 8/2017 |
| WO | 2021/007774 A1 | 1/2021 |

* cited by examiner

DISPLAY SUBSTRATE COMPRISING SUB-PIXEL STRUCTURES HAVING A TARGET SUB-PIXEL STRUCTURE AND DISPLAY DEVICE

CROSS-REFERENCE TO RELATED APPLICATION

This application is the U.S. national phase of PCT Application No. PCT/CN2022/090123 filed on Apr. 29, 2022, the entire contents of which are hereby incorporated by reference.

TECHNICAL FIELD

The present disclosure relates to the field of display technology, in particular to a display substrate and a display device.

BACKGROUND

In a twisted Nematic (TN)-type panel, nematic liquid crystals form a 90° twisted alignment structure in a display screen. When a voltage is applied to upper and lower electrodes of the display screen, liquid crystal molecules are arranged vertically, so the twisted structure disappears, and an optical rotation phenomenon disappears too. When no voltage is applied, the liquid crystal molecules return to be arranged in the original twisted manner under the effect of an anchoring force generated at a surface of an alignment film. Through controlling a magnitude of the applied voltage, it is able to control a twist degree of the TN liquid crystal molecules, thereby to control the brightness of light transmitted through the liquid crystals.

SUMMARY

In one aspect, the present disclosure provides in some embodiments a display substrate, including a first substrate, and scanning lines and data lines arranged on the first substrate. The scanning lines extend along a first direction and arranged along a second direction on the first substrate, the data lines are arranged along the first direction and extend along the second direction on the first substrate, and the first direction intersects the second direction. The display substrate includes a plurality of pixel structures, each pixel structure includes a plurality of sub-pixel structures, each sub-pixel structure includes a common electrode and a pixel electrode, and an orthogonal projection of the common electrode onto the first substrate overlaps with an orthogonal projection of the pixel electrode onto the first substrate. The sub-pixel structures include a target sub-pixel structure, the common electrode of the target sub-pixel structure includes a first portion, a second portion, a third portion, and a fourth portion, and the first portion and the second portion are arranged along the first direction and extend along the second direction. The first portion is coupled to the second portion through the third portion at a side away from the scanning line corresponding to the target sub-pixel structure. The fourth portion is coupled to the first portion at a side of the first portion close to the second portion and at a side close to the scanning line corresponding to the target sub-pixel structure, and the fourth portion is separated from the second portion.

In a possible embodiment of the present disclosure, a minimum distance between the second portion and the fourth portion is greater than a half of a distance between the first portion and the second portion.

In a possible embodiment of the present disclosure, the minimum distance between the second portion and the fourth portion is greater than 60% of the distance between the first portion and the second portion.

In a possible embodiment of the present disclosure, the minimum distance between the second portion and the fourth portion is greater than 36 microns.

In a possible embodiment of the present disclosure, the minimum distance between the second portion and the fourth portion is greater than 38.3 microns.

In a possible embodiment of the present disclosure, the plurality of sub-pixel structures further includes a first sub-pixel structure, the first sub-pixel structure corresponds to a sub-pixel in a color different from the target sub-pixel structure, and the common electrode of the first sub-pixel structure includes a fifth portion, a sixth portion, and a seventh portion. The fifth portion and the sixth portion are arranged along the first direction and extend along the second direction, and the fifth portion is coupled to the sixth portion through the seventh portion at a side away from the scanning line corresponding to the first sub-pixel structure. A width of each of the fifth portion and the sixth portion is greater than a width of each of the first portion and the second portion in the first direction, and a width of at least a part of the third portion is larger than a width of the seventh portion in the second direction.

In a possible embodiment of the present disclosure, at least a part of an orthogonal projection of the fourth portion onto the first portion does not overlap with an orthogonal projection of the second portion onto the first portion in the first direction.

In a possible embodiment of the present disclosure, the orthogonal projection of the fourth portion onto the first portion does not overlap with the orthogonal projection of the second portion onto the first portion in the first direction.

In a possible embodiment of the present disclosure, the display substrate includes a half via-hole structure, and the pixel electrode of the target sub-pixel structure is electrically coupled to a sub-pixel driving circuitry corresponding to the target sub-pixel structure through the half via-hole structure. An orthogonal projection of the half via-hole structure onto the first substrate overlaps with an orthogonal projection of a target line onto the first substrate, and the target line is a line between positions where a distance between the second portion and the fourth portion is smallest.

In a possible embodiment of the present disclosure, the plurality of sub-pixel structures further includes a first sub-pixel structure, the first sub-pixel structure corresponds to a sub-pixel in a color different from the target sub-pixel structure, and an area of the orthogonal projection of the half via-hole structure corresponding to the target sub-pixel structure onto the first substrate is greater than an area of an orthogonal projection of the first sub-pixel structure onto the first substrate.

In a possible embodiment of the present disclosure, the target sub-pixel structure corresponds to a blue sub-pixel.

In another aspect, the present disclosure provides in some embodiments a display panel including the above-mentioned display substrate and an opposite substrate arranged opposite to each other to form a box.

In a possible embodiment of the present disclosure, the display panel further includes a black matrix. An orthogonal projection of the black matrix onto the first substrate covers an orthogonal projection of the target line onto the first substrate, and the target line is a line between positions where the distance between the second portion and the fourth portion is smallest.

In a possible embodiment of the present disclosure, an aperture region of the target sub-pixel structure is divided by the black matrix into a first region and a second region independent of each other.

In a possible embodiment of the present disclosure, a width of the black matrix is 6 microns to 10 microns in a region corresponding to the target line in a direction perpendicular to the target line.

In a possible embodiment of the present disclosure, the display substrate is a color film array substrate and the black matrix is arranged on the color film array substrate; or the display substrate is an array substrate, the opposite substrate is a color film substrate, and the black matrix is arranged on the color film substrate.

BRIEF DESCRIPTION OF THE DRAWINGS

In order to illustrate the technical solutions of the present disclosure in a clearer manner, the drawings desired for the present disclosure will be described hereinafter briefly. Obviously, the following drawings merely relate to some embodiments of the present disclosure, and based on these drawings, a person skilled in the art may obtain the other drawings without any creative effort.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Such words as "first" and "second" involved in the specification and the appended claims are merely used to differentiate different objects rather than to represent any specific order. It should be appreciated that, the data used in this way may be replaced with each other, so as to implement the embodiments in an order other than that shown in the drawings or described in the specification. In addition, such terms as "include" or "including" or any other variations involved in the present disclosure intend to provide non-exclusive coverage, so that a procedure, method, system, product or device including a series of steps or units may also include any other elements not listed herein, or may include any inherent steps or units of the procedure, method, system, product or device. In addition, the expression "and/or" in the description and the appended claims is merely used to represent at least one of the objects before and after the expression. For example, "A and/or B and/or C" represents seven situations, i.e., there is only A, there is only B, there is only C, there are both A and B, there are both only B and C, thereby are both A and C, and there are A, B and C.

Figure 1:
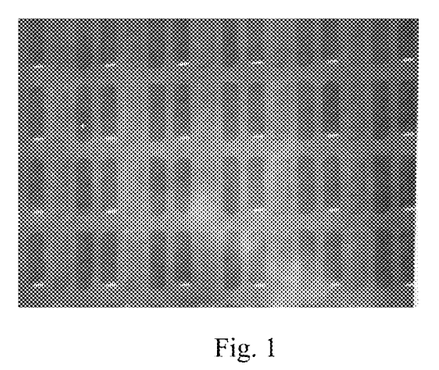
FIG. 1 is a schematic view showing a display effect of a conventional display device.
Figure 2:
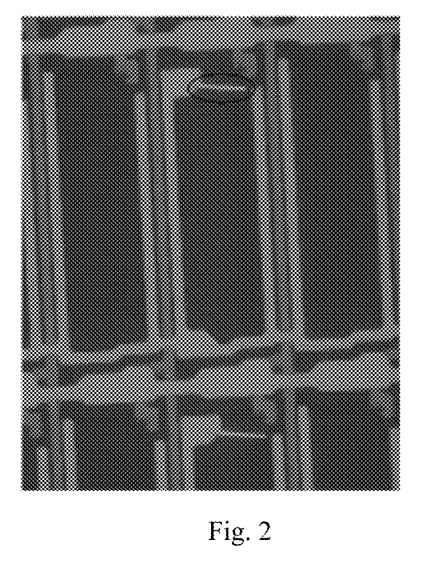
FIG. 2 is a micro diagram of the conventional display device.

As shown in FIGS. 1 and 2, in actual use, local bright spots appear for a TN-type display device. As shown in FIG. 2, a bright spot appears microscopically as a bright blue line. It is found through researches that, liquid crystal molecules are in a flow equilibrium state in a normal state, but when a display panel is pressed, the liquid crystal molecules flow laterally, are squeezed at a position where a lateral dimension is relatively small, and return to an original state slowly, so the bright blue line occurs.

The present disclosure provides in some embodiments a display substrate.

In some embodiments of the present disclosure, the display substrate is a display substrate of a TN-type display device.

Figure 3A:
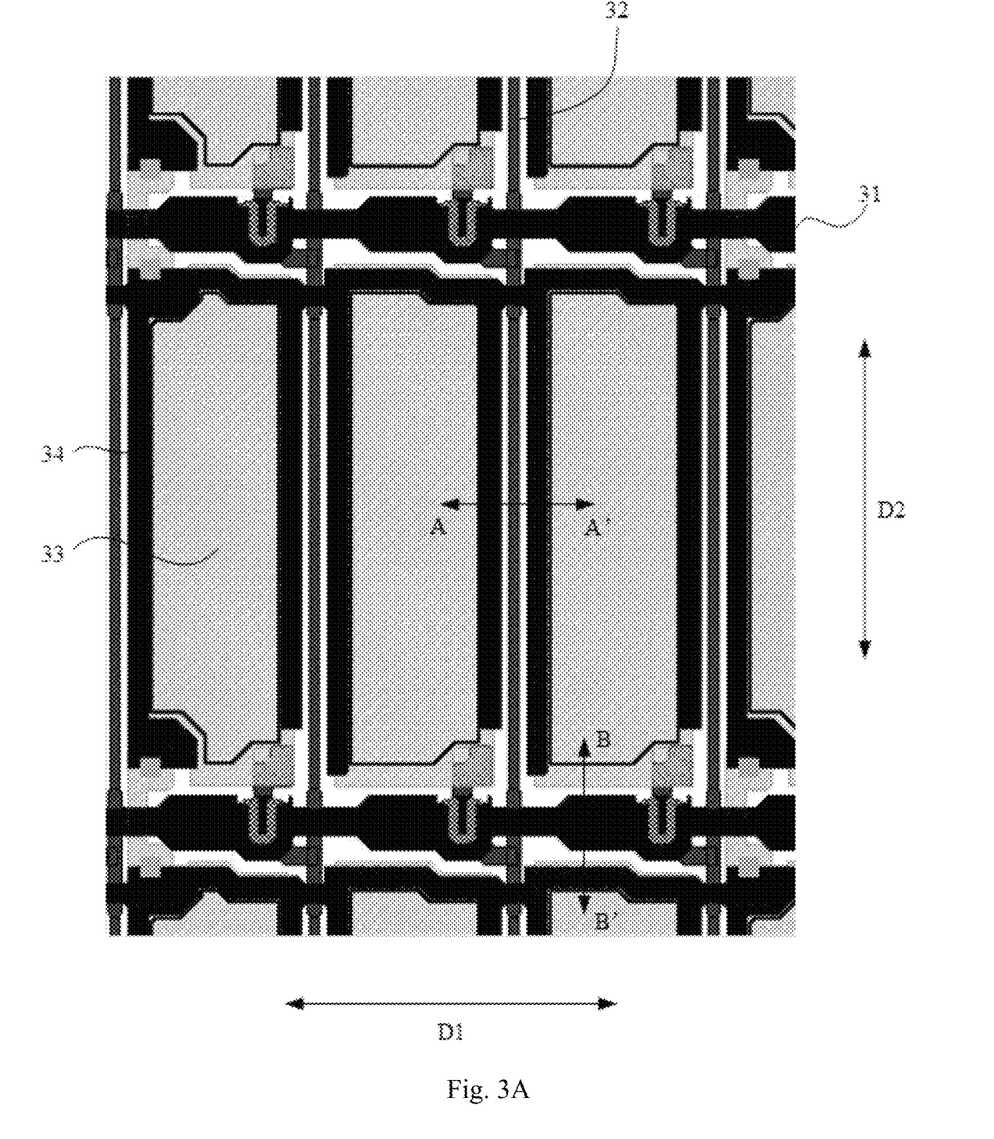
FIG. 3A is a schematic view showing a display substrate according to one embodiment of the present disclosure.
Figure 4A:
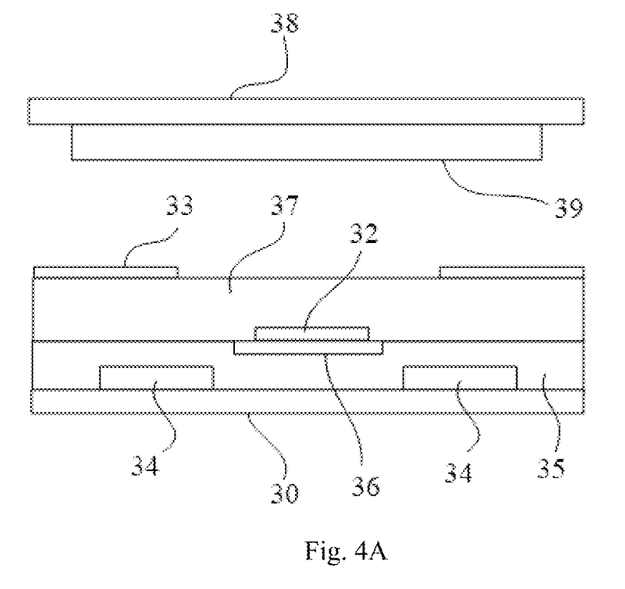
FIG. 4A is a sectional view of the display substrate in FIG. 3A along line A-A'.
Figure 4B:
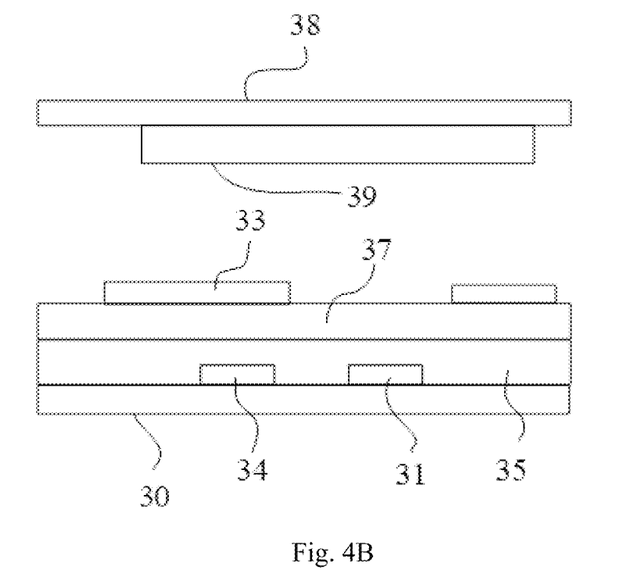
FIG. 4B is a sectional view of the display substrate in FIG. 3A along line B-B'.

As shown in FIGS. 3A, 4A, and 4B, in some embodiments of the present disclosure, the display substrate includes a first substrate 30, and scan lines 31 and data lines 32 on the first substrate 30.

Figure 5:
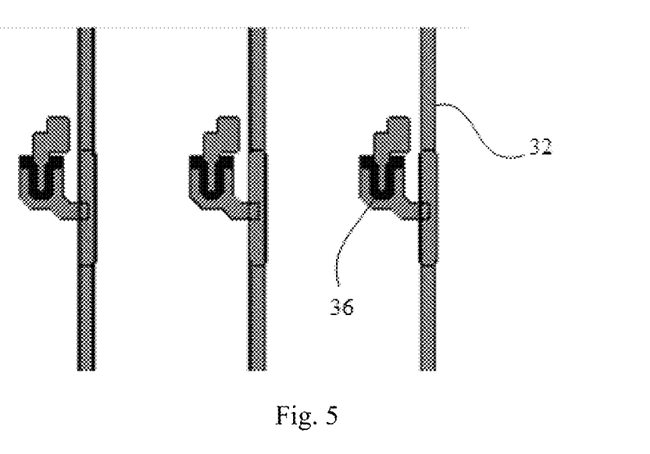
FIG. 5 is a schematic view showing a data line according to one embodiment of the present disclosure.

As shown in FIGS. 4A, 4B, and 5, the display substrate further includes some other structures, e.g., a first insulation layer 35, an active layer 36, and a second insulation layer 37, which will not be particularly defined herein.

Figure 6:
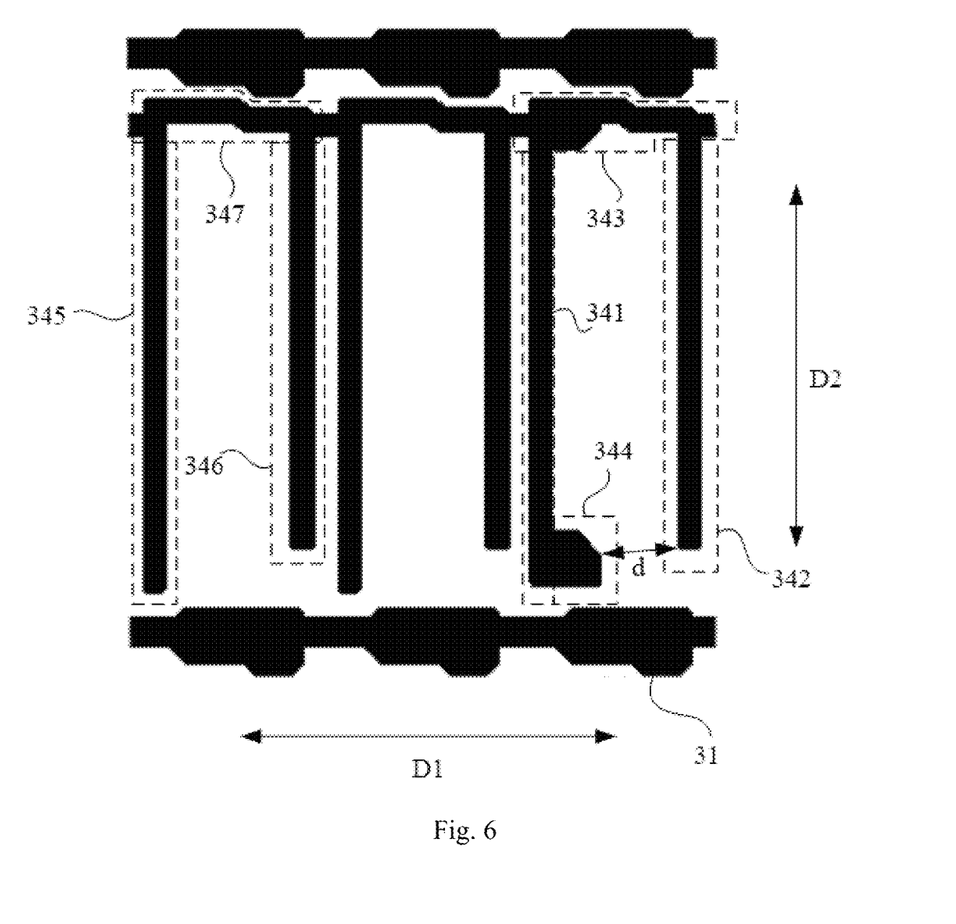
FIG. 6 is a schematic view showing a common electrode according to one embodiment of the present disclosure.

As shown in FIGS. 3A, 5, and 6, the scanning lines 31 extend along a first direction D1 and are arranged along a second direction D2 on the first substrate 30, the data lines 32 are arranged along the first direction D1 and extend along the second direction D2 on the first substrate 30, and the first direction D1 intersects the second direction D2.

Illustratively, the first direction D1 is a row direction of the display substrate, the second direction D2 is a column direction of the display substrate, and the first direction D1 is substantially perpendicular to the second direction D2. Obviously, the first direction D1 and the second direction D2 are not limited thereto, and they may be adjusted adaptively.

The display substrate includes a plurality of pixel structures. Generally, each pixel structure includes a plurality of sub-pixel structures, and more specifically, each pixel structure includes sub-pixel structures corresponding to a plurality of sub-pixels in different colors.

Figure 7:
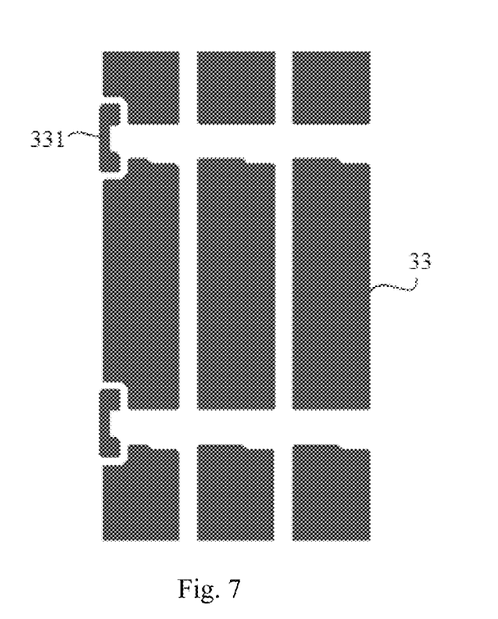
FIG. 7 is a schematic view showing a pixel electrode according to one embodiment of the present disclosure.

As shown in FIGS. 6 and 7, the sub-pixel structure includes a common electrode 34 and a pixel electrode 33, and the common electrode 34 overlaps with the pixel electrode 33. It should be appreciated that, when the common electrode 34 overlaps with the pixel electrode 33, it means that an orthogonal projection of the common electrode 34 onto the first substrate 30 overlaps with an orthogonal projection of the pixel electrode 33 onto the first substrate 30. A storage capacitor of the sub-pixel structure is formed through an overlapping portion between the common electrode 34 and the pixel electrode 33.

As shown in FIG. 6, in a possible embodiment of the present disclosure, the common electrode 34 is arranged at a same layer and made of a same material as the scanning line 31, i.e., the common electrode 34 and the scanning line 31 are formed through a single patterning process. In the second direction D2, the common electrodes 34 and the scanning lines 31 are arranged alternately. In a state as shown in FIG. 3A, the scanning line 31 corresponding to each sub-pixel structure is arranged below the common electrode 34 of the sub-pixel structure, and the scanning line 31 above the sub-pixel structure corresponds to the sub-pixel structure in a previous row.

In the first direction D1, the common electrodes 34 of the sub-pixel structures corresponding to sub-pixels in one row are arranged in sequence, and the common electrodes 34 in a same row are electrically coupled to each other in sequence to provide a same common power source signal.

In some embodiments of the present disclosure, the sub-pixel structures include a target sub-pixel structure, and further include a first sub-pixel structure. The first sub-pixel structure corresponds to a sub-pixel in a color different from the target sub-pixel structure.

Illustratively, each pixel of the display substrate includes three sub-pixels, i.e., a red sub-pixel, a blue sub-pixel, and a green sub-pixel. The target sub-pixel structure corresponds to the blue sub-pixel and the first sub-pixel structure corresponds to the red sub-pixel or the green sub-pixel.

It is to be appreciated that, the above is merely for illustrative purposes, and a correspondence between each sub-pixel structure and the sub-pixel will not be particularly defined herein.

As shown in FIG. 6, the common electrode 34 of the target sub-pixel structure includes a first portion 341, a second portion 342, a third portion 343, and a fourth portion 344, and the first portion 341 and the second portion 342 are arranged along the first direction D1 and extend along the second direction D2.

The first portion 341 is coupled to the second portion 342 through the third portion 343 at a side away from the scanning line 31 corresponding to the target sub-pixel structure.

As shown in FIG. 6, the common electrode 34 of the first sub-pixel structure includes a fifth portion 345, a sixth portion 346, and a seventh portion 347. The fifth portion 345 and the sixth portion 346 are arranged along the first direction D1 and extend along the second direction D2. The fifth portion 345 is coupled to the sixth portion 346 through the seventh portion 347 at a side away from the scanning line 31 corresponding to the first sub-pixel structure.

As shown in FIG. 6, the common electrode 34 of the first sub-pixel structure is substantially of an inverted U-like shape, and the common electrode 34 of the target sub-pixel structure is also substantially of a U-like shape. The target sub-pixel structure differs from the first sub-pixel structure mainly in that the common electrode 34 of the target sub-pixel structure further includes a protrusion, i.e., the fourth portion 344.

The fourth portion 344 is coupled to the first portion 341 at a side of the first portion 341 close to the second portion 342 and at a side close to the scanning line 31 corresponding to the target sub-pixel structure, and the fourth portion 344 is separated from the second portion 342.

As shown in FIG. 6, in the embodiments of the present disclosure, the fourth portion 344 is substantially of a shape obtained through splicing a right-angled trapezoid with a rectangle. The rectangle is directly coupled to an edge of the first portion 341 close to the second portion 342. A longer baseline of the right-angled trapezoid has a same length as, and is coupled to, one side of the rectangle. An oblique side of the right-angled trapezoid is arranged at a side close to the third portion 343, and a vertical side of the right-angled trapezoid extends along one side of the rectangle.

Through the fourth portion 344, it is able to further increase an area of the common electrode 34 of the sub-pixel corresponding to the target sub-pixel structure, and increase a capacitance of the storage capacitor corresponding to the sub-pixel corresponding to the target sub-pixel structure, thereby to improve a display effect.

As shown in FIG. 6, in some embodiments of the present disclosure, a minimum distance between the second portion 342 and the fourth portion 344 is greater than a half of a distance between the first portion 341 and the second portion 342. Further, in some embodiments of the present disclosure, the minimum distance between the second portion 342 and the fourth portion 344 is greater than 60% of the distance between the first portion 341 and the second portion 342.

It should be appreciated that, when the distance between the fourth portion 344 and the second portion 342 is relatively small, liquid crystals may be squeezed and thereby bright spots may occur along a target line. In the embodiments of the present disclosure, a line between the positions where the distance between the second portion 342 and the fourth portion 344 is smallest is defined as the target line.

It should be further appreciated that, the target line corresponds to the minimum distance between the fourth portion 344 and the second portion 342. In this regard, the bright spots may not occur in the other regions as long as the bright spot does not occur in a region corresponding to the target line.

In the embodiments of the present disclosure, the lateral flow of the liquid crystals may be adjusted in different ways.

As shown in FIG. 6, in some embodiments of the present disclosure, the lateral flow of the liquid crystals is adjusted through increasing a minimum linear distance between the second portion 342 and the fourth portion 344.

It should be appreciated that, when the distance between the first portion 341 and the second portion 342 is sufficiently large, the bright spots may not occur. In the embodiments of the present disclosure, the bright spots may be prevented through adjusting the minimum distance between the first portion 341 and the fourth portion 344, i.e., adjusting a length of the target line.

In some embodiments of the present disclosure, the minimum distance between the second portion 342 and the fourth portion 344 is greater than 36 microns. Further, in some embodiments of the present disclosure, the minimum distance between the second portion 342 and the fourth portion 344 is greater than 38.3 microns. Tests show that the bright spots are prevented.

Figure 3B:
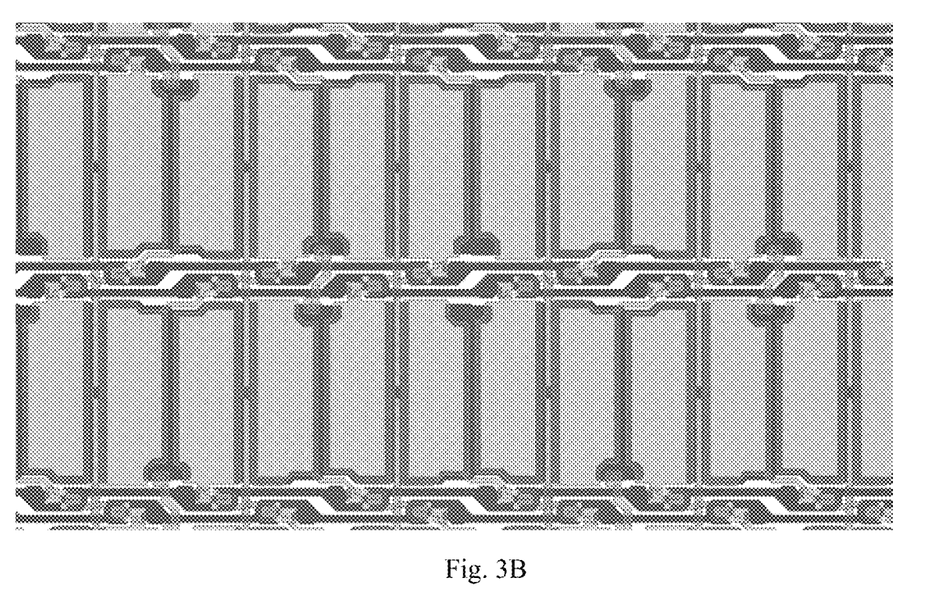
FIG. 3B is another schematic view showing the display substrate according to one embodiment of the present disclosure.

As shown in FIGS. 3A and 3B, for the display substrates of different structures, positions of the lines and the arrangement of the sub-pixels may be adjusted adaptively.

In the embodiments of the present disclosure, the minimum distance between the first portion 341 and the fourth portion 344 may be adjusted in different ways.

As shown in FIG. 6, in a possible embodiment of the present disclosure, the minimum distance is adjusted through adjusting a width of each of the first portion 341 and the second portion 342. Specifically, a width of each of the fifth portion 345 and the sixth portion 346 is greater than the width of each of the first portion 341 and the second portion 342 in the first direction D1.

Specifically, as compared with the first sub-pixel structure, a width of each "arm" portion of the U-like common electrode 34 of the target sub-pixel structure (i.e., the first portion 341, the second portion 342, the fifth portion 345, and the sixth portion 346) is reduced in the first direction D1, so as to increase the minimum distance between the first portion 341 and the fourth portion 344.

A width of at least a part of the third portion 343 is larger than a width of the seventh portion 347 in the second direction D2. Further, in order to prevent a decrease in the capacitance of the storage capacitor of the target sub-pixel structure, the width of the third portion 343 in the second direction D2 is increased. In this regard, a total area of the target sub-pixel structure remains unchanged or increases to prevent a decrease in the capacitance of the storage capacitor of the target sub-pixel structure.

In the case of the change in the width of the third portion 343, in the embodiments of the present disclosure, a width of the scanning line 31 is adjusted accordingly. Specifically, in the case of the change in the width of the third portion 343, the width of the scanning line 31 corresponding to the target sub-pixel structure in a previous row in the direction as shown in FIG. 2 is appropriately reduced, so as to provide a sufficient space for a line for the common electrode 34.

In the embodiments of the present disclosure, a position of the fourth portion 344 may also be adjusted to adjust the minimum distance between the fourth portion 344 and the second portion 342.

In some embodiments of the present disclosure, at least a part of the orthogonal projection of the fourth portion 344 onto the first portion 341 does not overlap with the orthogonal projection of the second portion 342 onto the first portion 341 in the first direction D1. Further, in some embodiments of the present disclosure, the orthogonal projection of the fourth portion 344 onto the first portion 341 does not overlap with the orthogonal projection of the second portion 342 onto the first portion 341 in the first direction D1.

It should be appreciated that, in the case that a vertical distance between the fourth portion 344 and the second portion 342 in a direction perpendicular to the direction in FIG. 2, the fourth portions 344 and the second portions 342 are arranged alternately, so as to increase the minimum linear distance between the fourth portion 344 and the second portion 342.

In some other embodiments of the present disclosure, a lateral movement distance of the liquid crystal molecules at a position where the target line is located is increased, so as to prevent the occurrence of the bright spot.

Figure 8:
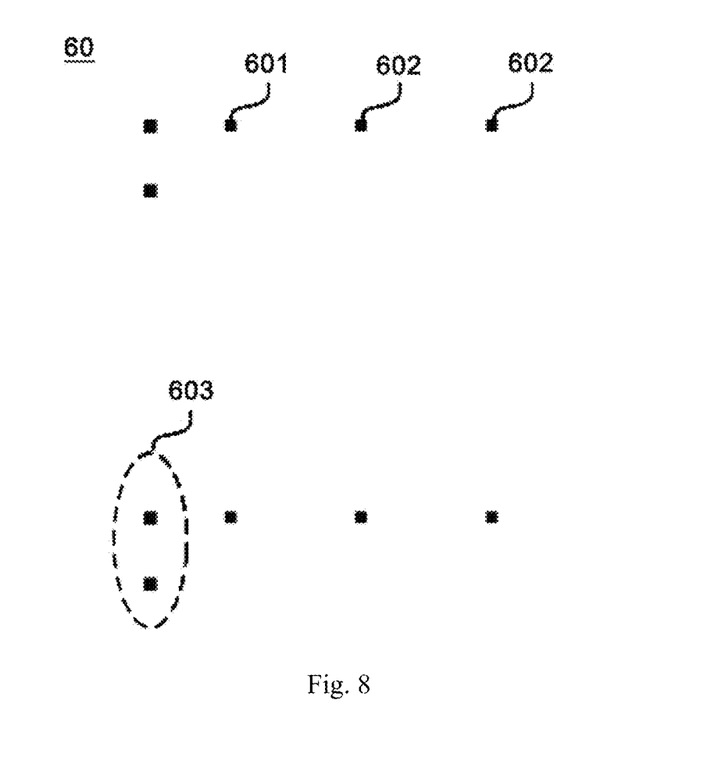
FIG. 8 is a schematic view showing the arrangement of a half via-hole structure according to one embodiment of the present disclosure.
Figure 9:
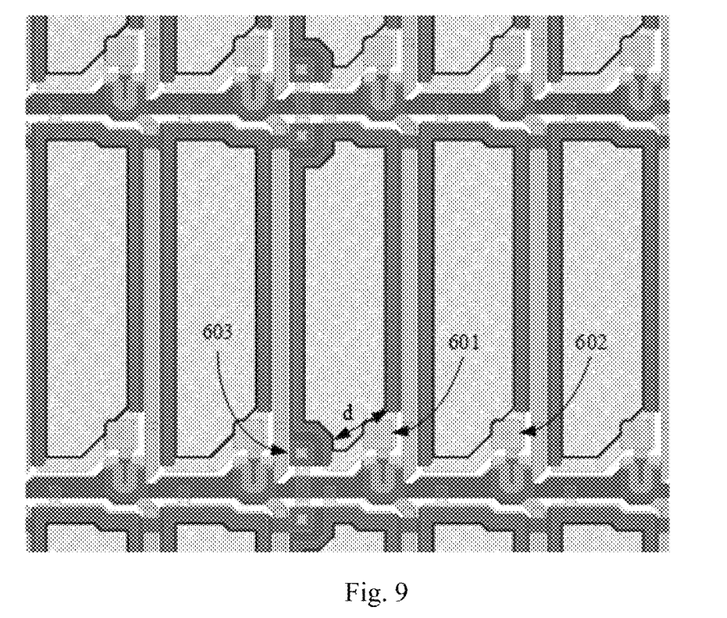
FIG. 9 is yet another schematic view showing the display substrate according to one embodiment of the present disclosure.

As shown in FIGS. 8 and 9, in some embodiments of the present disclosure, the display substrate includes a half via-hole structure 60 of a circular or square shape, which will not be particularly defined herein.

In the embodiments of the present disclosure, the half via-hole structure 60 specifically includes a first half via-hole 601, a second half via-hole 602, and a third half via-hole 603.

The first half via-hole 601 corresponds to the target sub-pixel structure, the second half via-hole 602 corresponds to the first sub-pixel structure, and the third half via 603 is used for the connection between an electrode connection member 331 and the common electrode 34.

As shown in FIGS. 7, 8, and 9, in the second direction D2, the common electrodes 34 in two adjacent rows are electrically coupled to each other through the electrode connection member 331, and the electrode connection member 331 is arranged at a same layer and made of a same material as the pixel electrode 33.

As shown in FIG. 8, the electrode connection member 331 is coupled to the common electrode 34 through the half via-hole structure 60.

The pixel electrode 33 of the sub-pixel structure is electrically coupled to a sub-pixel driving circuitry corresponding to the sub-pixel structure through the half via-hole structure 60, and specifically the pixel electrode 33 is electrically coupled to the data line 32 under the control of a switch controlled by the scanning line 31.

In the embodiments of the present disclosure, an orthogonal projection of the half via-hole structure 60 corresponding to the target sub-pixel structure onto the first substrate 30 overlaps with an orthogonal projection of the target line onto the first substrate 30.

It should be appreciated that, in general, a region corresponding to the target line is relatively even, and due to the presence of the half via-hole structure 60, a corresponding region of the display substrate is uneven. In the embodiments of the present disclosure, the half via-hole structure 60 is arranged on the target line, and in the case that a length of the target line is constant, an actual lateral movement distance of the liquid crystal along the target line is greater than the length of the target line due to the half via-hole structure 60. In other words, the actual lateral movement distance of the liquid crystal is increased, i.e., a lateral flow space for the liquid crystal is increased. In this regard, it is able to prevent the liquid crystals from being squeezed, thereby to reduce the probability of the bright spot.

In some embodiments of the present disclosure, an area of the orthogonal projection of the half via-hole structure 60 corresponding to the target sub-pixel structure onto the first substrate 30 is greater than an area of the orthogonal projection of the first sub-pixel structure onto the first substrate 30.

In some embodiments of the present disclosure, the area of the half via-hole structure 60 corresponding to the target sub-pixel structure is increased so as to further increase the lateral flow space for the liquid crystals, and prevent the liquid crystal molecules from being squeezed, thereby to reduce the probability of the bright spot.

The present disclosure further provides in some embodiments a display panel including the above-mentioned display substrate and an opposite substrate arranged opposite to the display substrate to form a cell. A liquid crystal layer is arranged between the display substrate and the opposite substrate.

Figure 10:
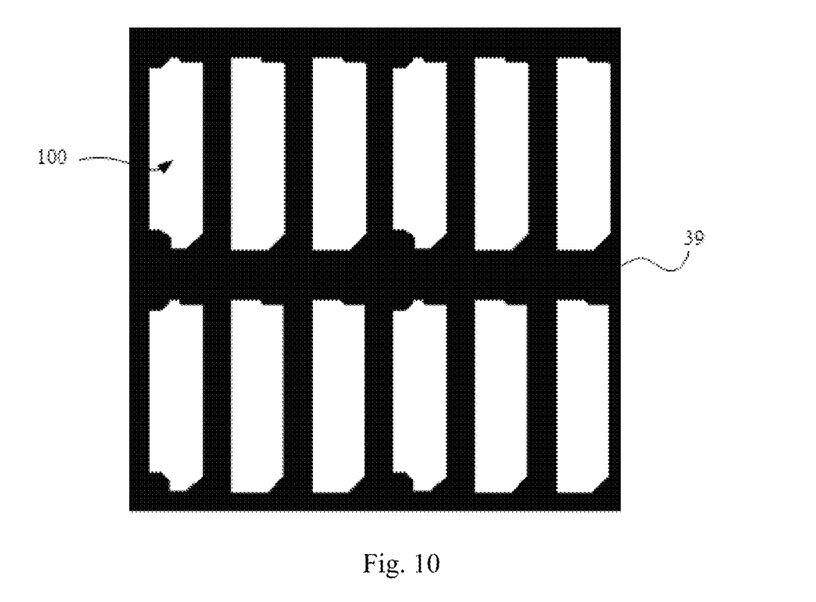
FIG. 10 is a schematic view showing a black matrix according to one embodiment of the present disclosure.

As shown in FIG. 10, in some embodiments of the present disclosure, the display panel further includes a black matrix 39. An uncovered region of the black matrix 39 forms an aperture region 100. In the embodiments of the present disclosure, the display substrate may be an array substrate or a color film array substrate. In the case that the display substrate is the color film array substrate, the black matrix 39 is arranged on the color film array substrate. As shown in FIGS. 4A and 4B, in the case that the display substrate is the array substrate, the opposite substrate is a color film substrate, and the black matrix 39 is provided on a second substrate 38 of the color film substrate.

Figure 11:
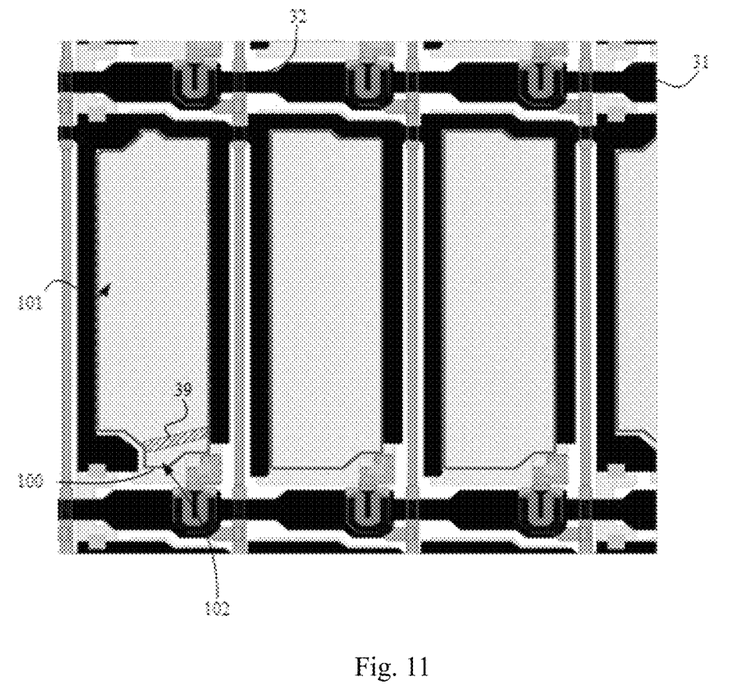
FIG. 11 is still yet another schematic view showing the display substrate according to one embodiment of the present disclosure.

As shown in FIGS. 10 and 11, in some other embodiments of the present disclosure, the black matrix 39 is also used to shield a region where the bright spot may occur, so as to prevent the occurrence of the bright spot visually.

An orthogonal projection of the black matrix 39 onto the first substrate 30 covers an orthogonal projection of the target line onto the first substrate 30.

It should be appreciated that, the black matrix 39 may be designed as that known in the art. No black matrix 39 is arranged in a region corresponding to the common electrode 34 of the target sub-pixel structure in the related art. However, in the embodiments of the present disclosure, the black matrix 39 is arranged in such a manner as to cover the target line.

As shown in FIGS. 10 and 11, specifically, in some embodiments of the present disclosure, the black matrix 39 covers a region between the first portion 341 and the fourth portion 344 with a width smaller than a predetermined threshold, i.e., a minimum width for the occurrence of the bright spot, e.g., 36 microns or 38.3 microns. In some embodiments of the present disclosure, the aperture region 100 of the target sub-pixel structure is divided by the black matrix 39 into a first region 101 with a larger area and a second region 102 with a smaller area, and the first region 101 is separated from the second region 102.

As shown in FIG. 11, a width of the black matrix 39 in a direction perpendicular to the target line is 6 microns to 10 microns, or 7 microns to 9 microns, or 8 microns, in a region corresponding to the target line, so as to prevent an aperture ratio from being adversely affected in the case of shielding the bright spot.

Figure 12:
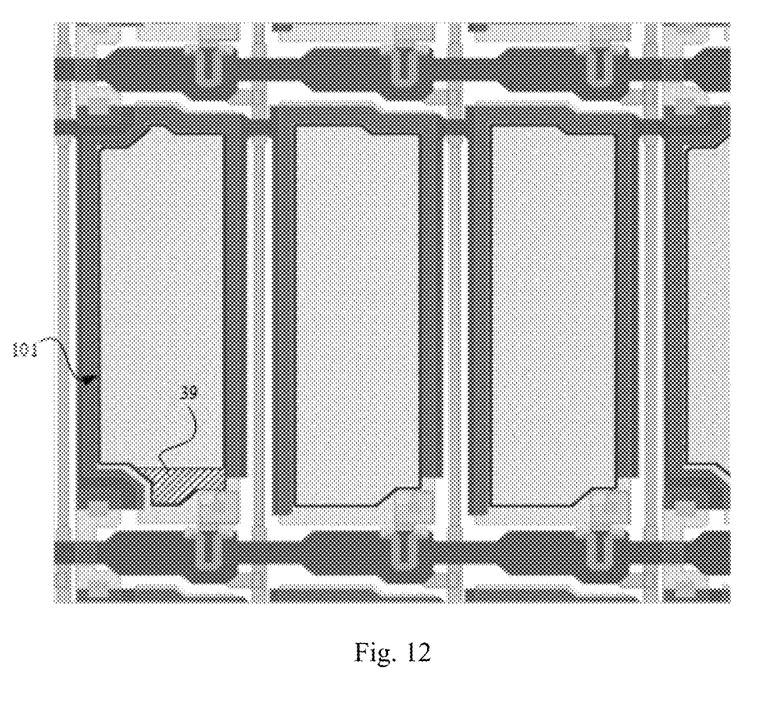
FIG. 12 is still yet another schematic view showing the display substrate according to one embodiment of the present disclosure.

As shown in FIG. 12, in some other embodiments of the present disclosure, an area of the black matrix 39 is directly increased, so that the black matrix 39 extends directly from a position where the target line is located to the scanning line 31 corresponding to the target sub-pixel structure. In other words, the black matrix 39 covers the region corresponding to the target line and the second region 102. As compared with the black matrix 39 having a smaller width, it is easy to form the black matrix 39 having a larger width.

TABLE 1 transmittances for sub-pixels in different colors

|  | White image L255 | Red image L255 | Green image L255 | Blue image L255 |
|---|---|---|---|---|
| Brightness | 242 | 46.7 | 175 | 18.47 |
| Transmittance | 100% | 19.3% | 72.3% | 7.63% |

As shown in Table 1, the transmittances of the sub-pixels in different colors are different. After testing, it is found through tests that, for a white image, a green sub-pixel contributes the most to the brightness (72.3%), and a blue sub-pixel contributes the least to the brightness (7.63%). In the case that the target sub-pixel structure corresponds to the blue sub-pixel, the display effect of the display device is adversely affected to the least extent, and meanwhile the implementation thereof is relatively easy.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising a first substrate, and scanning lines and data lines arranged on the first substrate, wherein the scanning lines extend along a first direction and arranged along a second direction on the first substrate, the data lines are arranged along the first direction and extend along the second direction on the first substrate, and the first direction intersects the second direction;
   the display substrate comprises a plurality of pixel structures, each pixel structure comprises a plurality of sub-pixel structures, each sub-pixel structure comprises a common electrode and a pixel electrode, and an orthogonal projection of the common electrode onto the first substrate overlaps with an orthogonal projection of the pixel electrode onto the first substrate;
   the sub-pixel structures comprise a target sub-pixel structure, the common electrode of the target sub-pixel structure comprises a first portion, a second portion, a third portion, and a fourth portion, and the first portion and the second portion are arranged along the first direction and extend along the second direction;
   the first portion is coupled to the second portion through the third portion at a side away from the scanning line corresponding to the target sub-pixel structure; and
   the fourth portion is coupled to the first portion at a side of the first portion close to the second portion and at a side close to the scanning line corresponding to the target sub-pixel structure, and the fourth portion is separated from the second portion;
   wherein the plurality of sub-pixel structures further comprises a first sub-pixel structure, the first sub-pixel structure corresponds to a sub-pixel in a color different from the target sub-pixel structure, and the common electrode of the first sub-pixel structure comprises a fifth portion, a sixth portion, and a seventh portion;
   the fifth portion and the sixth portion are arranged along the first direction and extend along the second direction, and the fifth portion is coupled to the sixth portion through the seventh portion at a side away from the scanning line corresponding to the first sub-pixel structure; and
   a width of each of the fifth portion and the sixth portion is greater than a width of each of the first portion and the second portion in the first direction, and a width of at least a part of the third portion is larger than a width of the seventh portion in the second direction.

2. The display substrate according to claim 1, wherein a minimum distance between the second portion and the fourth portion is greater than a half of a distance between the first portion and the second portion.

3. The display substrate according to claim 2, wherein the minimum distance between the second portion and the fourth portion is greater than 60% of the distance between the first portion and the second portion.

4. The display substrate according to claim 1, wherein the minimum distance between the second portion and the fourth portion is greater than 36 microns.

5. The display substrate according to claim 4, wherein the minimum distance between the second portion and the fourth portion is greater than 38.3 microns.

6. The display substrate according to claim 1, wherein at least a part of an orthogonal projection of the fourth portion onto the first portion does not overlap with an orthogonal projection of the second portion onto the first portion in the first direction.

7. The display substrate according to claim 6, wherein the orthogonal projection of the fourth portion onto the first portion does not overlap with the orthogonal projection of the second portion onto the first portion in the first direction.

8. The display substrate according to claim 1, wherein the display substrate comprises a half via-hole structure, and the pixel electrode of the target sub-pixel structure is electrically coupled to a sub-pixel driving circuitry corresponding to the target sub-pixel structure through the half via-hole structure; and an orthogonal projection of the half via-hole structure onto the first substrate overlaps with an orthogonal projection of a target line onto the first substrate, and the target line is a line between positions where a distance between the second portion and the fourth portion is smallest.

9. The display substrate according to claim 8, wherein an area of the orthogonal projection of the half via-hole structure corresponding to the target sub-pixel structure onto the first substrate is greater than an area of an orthogonal projection of the first sub-pixel structure onto the first substrate.

10. The display substrate according to claim 1, wherein the target sub-pixel structure corresponds to a blue sub-pixel.

11. A display device, comprising the display substrate according to claim 1 and an opposite substrate arranged opposite to each other to form a box.

12. The display device according to claim 11, further comprising a black matrix, wherein an orthogonal projection of the black matrix onto the first substrate covers an orthogonal projection of the target line onto the first substrate, and the target line is a line between positions where the distance between the second portion and the fourth portion is smallest.

13. The display device according to claim 12, wherein an aperture region of the target sub-pixel structure is divided by the black matrix into a first region and a second region independent of each other.

14. The display device according to claim 13, wherein a width of the black matrix is 6 microns to 10 microns in a region corresponding to the target line in a direction perpendicular to the target line.

15. The display device according to claim 12, wherein the display substrate is a color film array substrate and the black matrix is arranged on the color film array substrate; or the display substrate is an array substrate, the opposite substrate is a color film substrate, and the black matrix is arranged on the color film substrate.

16. The display substrate according to claim 2, wherein the target sub-pixel structure corresponds to a blue sub-pixel.

17. The display substrate according to claim 3, wherein the target sub-pixel structure corresponds to a blue sub-pixel.

18. The display substrate according to claim 4, wherein the target sub-pixel structure corresponds to a blue sub-pixel.

19. The display substrate according to claim 5, wherein the target sub-pixel structure corresponds to a blue sub-pixel.

* * * * *